United States Patent [19]
Flietner et al.

[11] Patent Number: 6,140,833
[45] Date of Patent: Oct. 31, 2000

[54] IN-SITU MEASUREMENT METHOD AND APPARATUS FOR SEMICONDUCTOR PROCESSING

[75] Inventors: Bertrand Flietner, Hopewell Junction; K. Paul Muller, Wappingers Falls, both of N.Y.

[73] Assignee: Siemens Aktiengesellschaft, Munich, Germany

[21] Appl. No.: 09/192,698

[22] Filed: Nov. 16, 1998

[51] Int. Cl.[7] .................................................. G01R 31/00
[52] U.S. Cl. ........................ 324/765; 324/763; 324/158.1
[58] Field of Search ................................. 324/765, 73.1, 324/763, 754, 537, 158.1

[56] References Cited

U.S. PATENT DOCUMENTS

| | | | |
|---|---|---|---|
| 4,961,053 | 10/1990 | Krug | 324/537 |
| 5,059,899 | 10/1991 | Farnworth et al. | 324/754 |
| 5,442,282 | 8/1995 | Rostoker et al. | 324/158.1 |
| 5,457,400 | 10/1995 | Ahmad et al. | 324/763 |
| 5,608,335 | 3/1997 | Tailliet | 324/763 |
| 5,701,666 | 12/1997 | DeHaven et al. | 324/754 X |

OTHER PUBLICATIONS

"A New Technique for Solving Wafer Charging Problems", Shideler et al., Semiconductor International, Jul. 1995, pp. 153–158.

*Primary Examiner*—Safet Metjahic
*Assistant Examiner*—T. R. Sundaram
*Attorney, Agent, or Firm*—Donald B. Paschburg

[57] ABSTRACT

A measurement device for in-situ measurement of processing parameters, in accordance with the present invention, includes a semiconductor wafer having at least one processed chip formed thereon. The processed chip further includes at least one sensor for measuring process parameters. A memory storage device for storing the process parameters as the process parameters are measured by the at least one sensor is also included. A timing device is provided for tracking the process parameters as a function of time, and a power supply is included for providing power to the at least one sensor, the memory storage device and the timing device. Also, a method is described for making measurements with the measurement device.

22 Claims, 4 Drawing Sheets

IN-SITU MEASUREMENT METHOD AND APPARATUS FOR SEMICONDUCTOR PROCESSING

BACKGROUND

1. Technical Field

This disclosure relates to semiconductor fabrication and more particularly, to an improved method and apparatus for in-situ parameter measurement and control to provide improved yield.

2. Description of the Related Art

Semiconductor processing involves maintaining a controlled environment for various fabrication steps. Semiconductor wafers are typically placed inside a chamber and exposed to various temperature and pressure conditions. During fabrication, control of these parameters impacts chip yield. Temperature differences across the wafer lead to process nonuniformity and result in yield loss.

Temperature is typically measured on the wafer using temperature dots or thermocouples. Temperature dots are fixed on the wafer and give a rough estimate of the temperature distribution across the wafer. Temperature dots do not generally measure the temperature at the surface of the wafer. Further, temperature dots have a resolution of only ±5° C. To effectively use temperature dots, it is often necessary to perform many trials to get a timely resolved temperature measurement. Even then, the temperature is not determined over the full wafer. A maximum temperature is reached and recorded by the temperature dots, but there is no time resolution of when the maximum temperature was reached. Thermocouples must be mounted on the wafer and suffer from the same deficiencies as temperature dots.

A "charm" wafer is commercially available from Wafer Charging Monitors, Inc. The "charm" wafer measures only peak values for temperature and therefore does not provide timely information since peak values could occur at various times during processing.

Therefore, a need exists for an apparatus and method for determining temperature at a wafer surface which is accurate and reliable. A further need exists for an apparatus and method for determining temperature for different chamber and/or chuck configurations.

SUMMARY OF THE INVENTION

A measurement device for in-situ measurement of processing parameters, in accordance with the present invention, includes a semiconductor wafer having at least one processed chip formed thereon. The processed chip further includes at least one sensor for measuring process parameters. A memory storage device for storing the process parameters as the process parameters are measured by the at least one sensor is also included. A timing device is provided for tracking the process parameters as a function of time, and a power supply is included for providing power to the at least one sensor, the memory storage device and the timing device.

Another measurement device for in-situ measurement of processing parameters includes a semiconductor wafer having at least one processed chip formed thereon. The processed chip further includes sensors for measuring process parameters and a memory storage device for storing process parameter data as the process parameters are measured by the sensors. A timing device is included for tracking the process parameters as a function of time, and a power supply is included for providing power to the at least one sensor, the memory storage device and the timing device. The semiconductor wafer also includes an interface mounted thereon for retrieving the process parameter data from the memory storage device.

In alternate embodiments, the at least one sensor includes a plurality of sensors either distributed across the semiconductor wafer, positioned at predetermined locations on the semiconductor wafer or both. The process parameters may include temperature, radiation, voltage or charge current. The memory storage device may include an electrically erasable programmable read only memory (EEPROM). The at least one sensor may include a p-n junction device. The power supply is preferably powered by an external light source. The measurement device may further include a processor for managing device functions.

A method for measuring process parameters during a semiconductor fabrication process includes the step of providing a semiconductor wafer having at least one processed chip formed thereon, the processed chip further including at least one sensor for measuring process parameters, a memory storage device for storing the process parameters as the process parameters are measured by the at least one sensor, a timing device for tracking the process parameters as a function of time and a power supply for providing power to the at least one sensor, the memory storage device and the timing device. The method further includes the steps of securing the wafer in a processing chamber, subjecting the wafer to a process to be tested, storing process parameter data according to the measured process parameters in the memory storage device during the duration of the process to be tested and retrieving the process parameter data.

In other methods, the process parameters preferably include temperature. The step of measuring temperature with a resolution of about 0.1 degree Celsius may also be included. The process parameters may also include at least one of radiation, voltage and charge currents.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to an improved method and apparatus for in-situ temperature measurement and control to provide improved yield. The present invention provides spatial, timely and accurate temperature measurement on a surface of a semiconductor wafer. In accordance with the present invention, a wafer is provided having a power source, and sensors for measuring various parameters during a fabrication process. The wafer tests parameters for processing prior to fabricating semiconductor wafers which are to be manufactured according to the tested process. In preferred embodiments, the wafer includes memory for storing data and a clock for recording parameters as a function of time.

Figure 1:
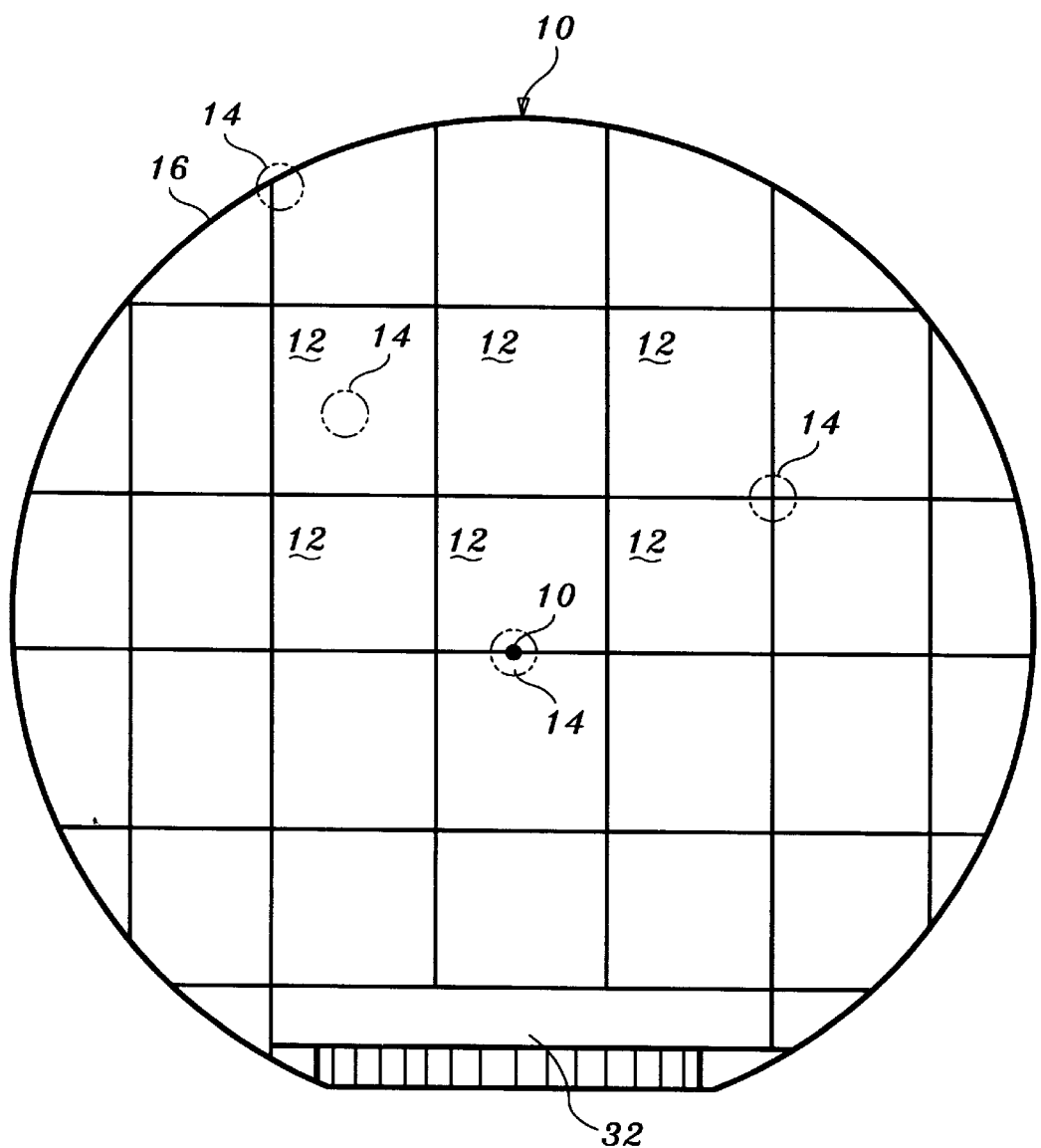
FIG. 1 is a top plan view of a semiconductor wafer having a plurality of devices with sensors and a power supply for making parameter measurements during a semiconductor fabrication process in accordance with the present invention.

Referring now in specific detail to the drawings in which like reference numerals identify similar or identical elements throughout the several views, and initially to FIG. 1, a wafer 10 is shown in accordance with the present invention. Wafer 10 is preferably a fully processed device having functional devices 12 formed thereon. Wafer 10 with devices 12 may be custom made for each individual application or have standardized wafers 10 with predetermined measurement features and devices.

Devices 12 are spatially distributed across wafer 10, in this way data may be gathered at various locations. In a preferred embodiment, devices 12 includes sensors 14 which may be activated in regions of particular interest, for example, at edges 16 of wafer or at a center 18 of wafer 12. Wafer 10 is capable of memory storage of data collected during processing. An interface 32 may be provided on wafer 10 to retrieve collected data.

Figure 2:
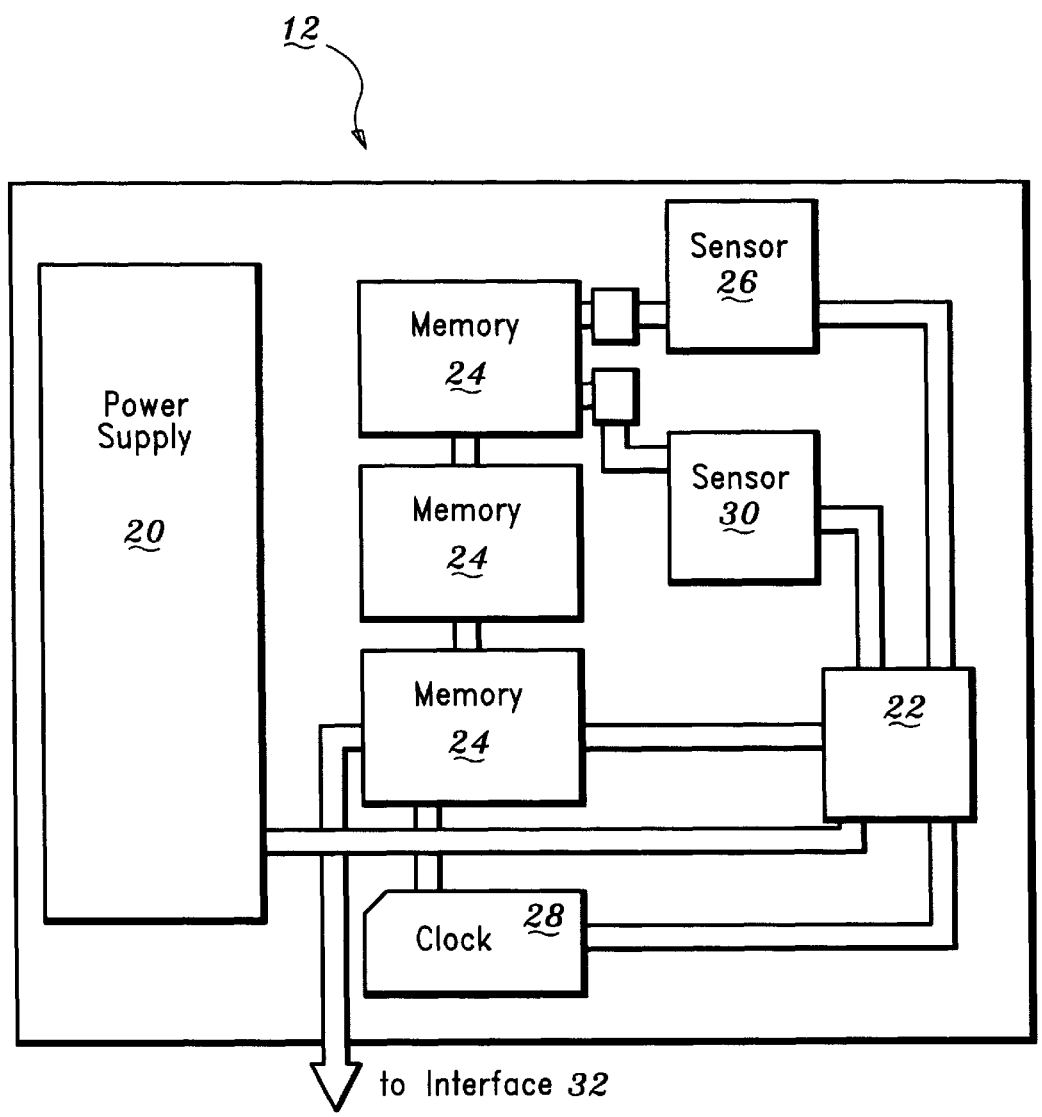
FIG. 2 is a schematic diagram showing the device of FIG. 1 in greater detail in accordance with the present invention.

Referring to FIG. 2, a device 12 is schematically shown. Device 12 includes a power supply 20. Power supply 20 preferably powered by an external light source or light generated from a plasma during processing. Power supply 20 may include a p-n junction device, i.e., a solar cell, integrated into wafer 10 or include a device externally mounted to a surface of wafer 10. Power supply 20 may include an energy storage device, such as a battery. Circuitry 22 is provided to connect power supply 20 to other devices and to convert a voltage of power supply 20 to a useable and stable energy supply. For example, circuitry may include filters and other conditioning components.

Device 12 further includes memory storage devices 24 for storing data therein. In a preferred embodiment, memory storage device 24 include electrically erasable programmable read only memory (EEPROM). Other types of memory are also contemplated. EEPROMs enable the storage of collected data and may serve as a voltmeter to measure threshold voltage shifts in transistors as described in "A new technique for solving wafer charging problems", by Shideler et. al., Semiconductor International, July 1995 pp. 153–158, incorporated herein by reference. Memory 24 are coupled to interface 32 such that data stored therein may be retrieved.

Device 12 includes temperature sensors 26. Temperature sensors 26 are mounted at or near the surface of wafer 10. Temperature sensors 26 include solid state devices integrated into wafer 10. The solid state devices for temperature preferably include p-n junction devices such that temperatures can be measured accurately in the order of tenths of a degree Celsius, for example with a resolution of 0.1 degrees C. Temperature sensors 26 may be distributed evenly over the surface of wafer 10 (FIG. 1) and/or positioned in regions of interest where additional data is desired. Other sensors 30 may be included on wafer 10, for example concentration sensors for measuring element concentration during processing, pressure sensors, voltage sensors, charge current sensors, radiation (UV) sensors, etc.

A clock 28 is preferably included in device 12. Clock 28 measures intervals between data collection cycles thereby measuring temperatures or other parameters as a function of time. Alternately elapsed time may be stored in memory devices 24 thereby resulting in time dependent measurements. Clock 28 may be a solid state device which measures time intervals and/or monitors the passage of time between data collection. Such a device may include CMOS technology. By including clock 28, the present invention advantageously provides monitoring and data collection tracking over a predetermined time interval thereby providing a more complete set of data. Further, fluctuations during processing may be monitored, such as plasma fluctuations.

The present invention is independent of chucks for holding wafer 10 and processing chambers for fabricating wafers since wafer is self-contained having all measurement devices and power supplies are integrated therein or coupled thereto. The present invention is installed in a chamber to test a fabrication process. During processing various parameters are measured and stored to be compared to desired values and tested for uniformity across wafer 10. When the process is completed, wafer 10 is removed from the chamber and the data is retrieved through a data interface 32 (FIG. 1). Using the collected data, the process parameters may be varied to achieve a more accurate and reliable process in accordance with the invention.

Figure 3:
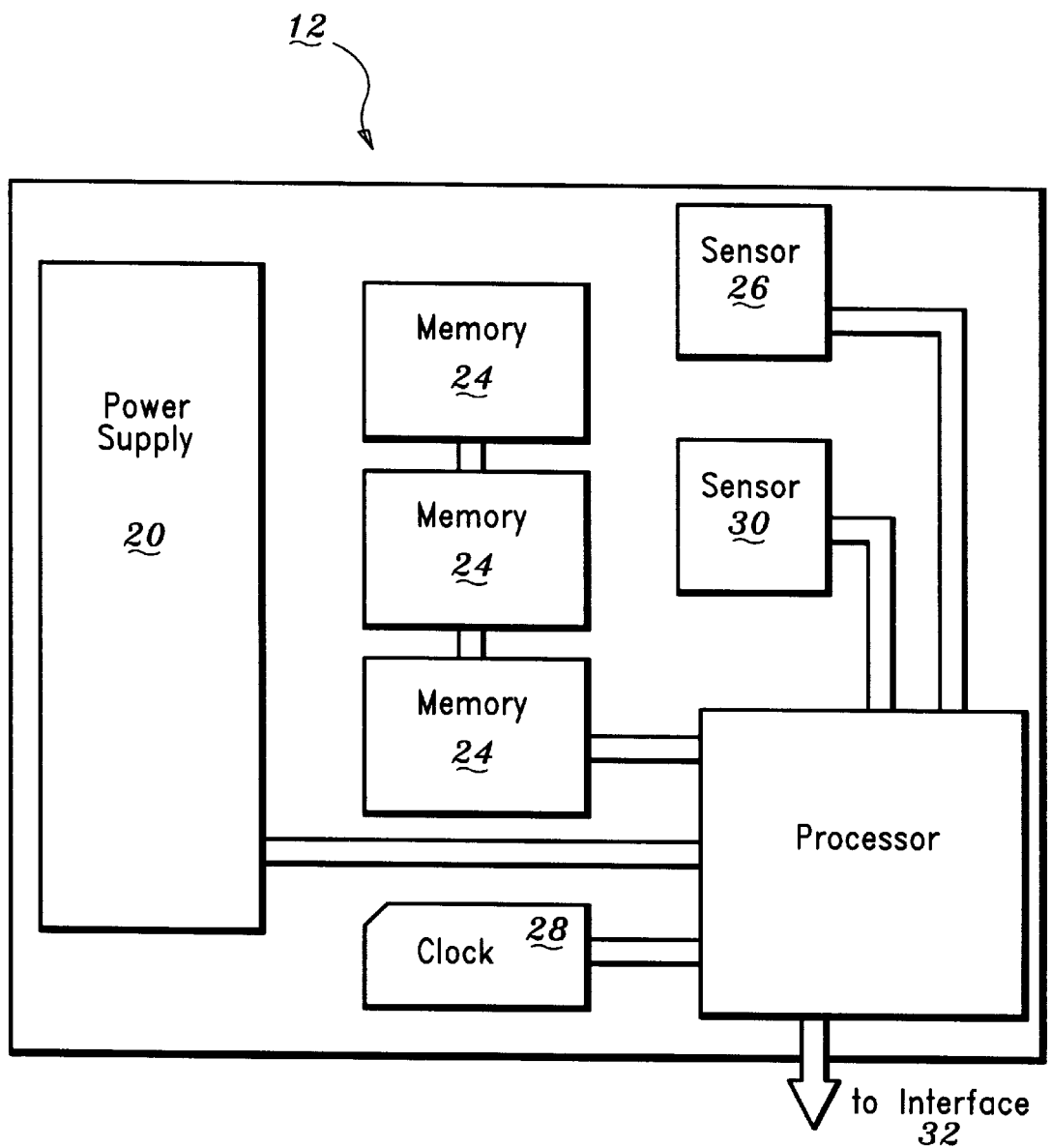
FIG. 3 is a schematic diagram of an alternate embodiment of the device in FIG. 2 show process/logic circuit for controlling functions of the device in according with the present invention.

Referring to FIG. 3, an alternate embodiment of the present invention is shown. A processor or logic circuitry 40 is included for controlling functions of device 12. Processors 40 may be included for each device 12 or a single processor 40 may be provided for a plurality of devices 12 to be located at a location other than device 12. Processor 40 preferably provides power conditioning of power supply 20 voltages. Processor 40 also controls data collection of sensors 26 and 30 according input from clock 28. Processor 40 further retrieves data form sensors 26 and 30 and stores and manages the data to be stored in memory storage devices 24. Processor 40 supplies data to interface 32 (FIG. 1).

Figure 4:
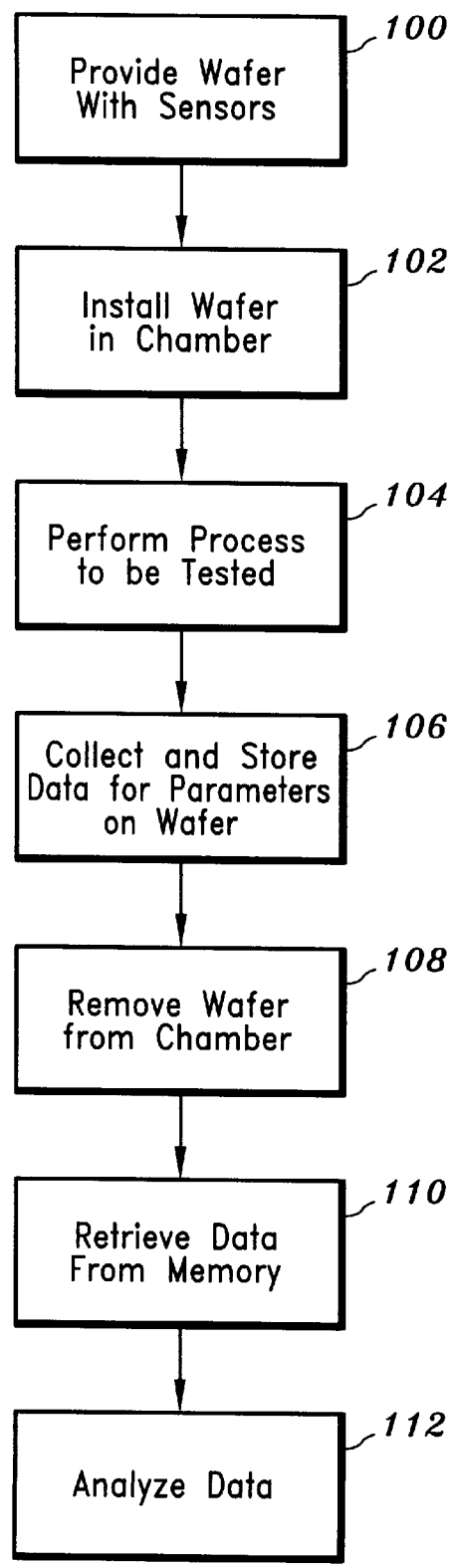
FIG. 4 is a flow diagram of a method for making in-situ measurements in accordance with the present invention.

Referring to FIG. 4, a method of measuring processing parameters is shown in accordance with the present invention. In block 100, a wafer is provided in accordance with the present invention. In block 102, the wafer is installed in a chamber using chucks. The present invention is independent of the chucks and chamber type. In block 104, a process to be tested is performed of the wafer. In block 106, data is collected and stored in memory, the parameters including temperatures, pressures, radiation levels, voltages, and/or charge currents. The data is collected over time intervals or at predetermined stages in the process. In block 108, when the process ends, the wafer is removed. In block 110, data is retrieved from memory. The data is analyzed and the process is modified according to predetermined specifications in block 112.

Having described preferred embodiments for a novel and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed:

1. A measurement device for in-situ measurement of processing parameters, comprising:

a semiconductor wafer having at least one processed chip formed thereon;

the processed chip for performing in-situ measurements of processing parameters, the processed chip further comprising:

at least one sensor for measuring the process parameters;

a memory storage device for storing the process parameters as the process parameters are measured by the at least one sensor;

a timing device for tracking the process parameters as a function of time; and a power supply for providing power to the at least one sensor, the memory storage device and the timing device.

2. The measurement device as recited in claim 1, wherein the at least one sensor includes a plurality of sensors distributed across the semiconductor wafer.

3. The measurement device as recited in claim 1, wherein the at least one sensor includes a plurality of sensors positioned at predetermined locations on the semiconductor wafer.

4. The measurement device as recited in claim 1, wherein the process parameters include temperature.

5. The measurement device as recited in claim 1, wherein the process parameters include at least one of radiation, voltage and charge current.

6. The measurement device as recited in claim 1, wherein the memory storage device includes an electrically erasable programmable read only memory (EEPROM).

7. The measurement device as recited in claim 1, wherein the at least one sensor includes a p-n junction device.

8. The measurement device as recited in claim 1, wherein the power supply is powered by an external light source.

9. The measurement device as recited in claim 1, wherein the measurement device further comprises a processor for managing device functions.

10. A measurement device for in-situ measurement of processing parameters, comprising:

a semiconductor wafer having at least one processed chip formed thereon;

the processed chip for performing in-situ measurements of processing parameters, the processed chip further comprising:

sensors for measuring the process parameters;

a memory storage device for storing process parameter data as the process parameters are measured by the sensors;

a timing device for tracking the process parameters as a function of time; and a power supply for providing power to the at least one sensor, the memory storage device and the timing device;

the semiconductor wafer including an interface mounted thereon for retrieving the process parameter data from the memory storage device.

11. The measurement device as recited in claim 10, wherein the sensors are distributed across the semiconductor wafer.

12. The measurement device as recited in claim 10, wherein the sensors are positioned at predetermined locations on the semiconductor wafer.

13. The measurement device as recited in claim 10, wherein the process parameters include temperature.

14. The measurement device as recited in claim 10, wherein the process parameters include at least one of radiation, voltage and charge current.

15. The measurement device as recited in claim 10, wherein the memory storage device includes an electrically erasable programmable read only memory (EEPROM).

16. The measurement device as recited in claim 10, wherein the sensors include a p-n junction device.

17. The measurement device as recited in claim 10, wherein the power supply is powered by an external light source.

18. The measurement device as recited in claim 10, wherein the measurement device further comprises a processor for managing device functions.

19. A method for measuring process parameters during a semiconductor fabrication process comprising the steps of:

providing a semiconductor wafer having at least one processed chip formed thereon, the processed chip for performing in-situ measurements of processing parameters, the processed chip further including at least one sensor for measuring the process parameters, a memory storage device for storing the process parameters as the process parameters are measured by the at least one sensor, a timing device for tracking the process parameters as a function of time and a power supply for providing power to the at least one sensor, the memory storage device and the timing device;

securing the wafer in a processing chamber;

subjecting the wafer to a process to be tested;

storing process parameter data according to the measured process parameters in the memory storage device during the duration of the process to be tested; and retrieving the process parameter data.

20. The method as recited in claim 19 wherein the process parameters include temperature.

21. The method as recited in claim 20, further comprises the step of measuring temperature with a resolution of about 0.1 degree Celsius.

22. The method as recited in claim 19 wherein the process parameters include at least one of radiation, voltage and charge currents.

* * * * *